(12) United States Patent
Corrado et al.

(10) Patent No.: US 6,639,803 B1
(45) Date of Patent: Oct. 28, 2003

(54) COMPLIANT HEAT SINK DEVICE/ MOUNTING SYSTEM INTERCONNECT AND A METHOD OF IMPLEMENTING SAME

(75) Inventors: Joseph P. Corrado, Marlboro, NY (US); Budy D. Notohardjono, Poughkeepsie, NY (US); Roger R. Schmidt, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/193,534

(22) Filed: Jul. 11, 2002

(51) Int. Cl.[7] .................................................. H05K 7/20
(52) U.S. Cl. .................. 361/719; 361/704; 361/707; 361/709; 174/16.3; 165/80.3; 165/185
(58) Field of Search ................................ 361/702, 703, 361/704, 709, 710, 719–721; 257/706, 718, 721, 722; 174/16.1, 16.3; 165/80.2, 80.3, 104.33, 185

(56) References Cited

U.S. PATENT DOCUMENTS

| | | | |
|---|---|---|---|
| 4,978,638 A | 12/1990 | Buller et al. ................ 437/209 |
| 5,282,111 A | 1/1994 | Hopfer ....................... 361/704 |
| 5,329,426 A | 7/1994 | Villani ....................... 361/719 |
| 5,761,041 A * | 6/1998 | Hassanzadeh et al. ...... 361/704 |
| 5,771,960 A | 6/1998 | Lin ........................... 165/80.3 |
| 5,791,403 A | 8/1998 | Chiou ........................ 165/80.3 |
| 5,802,707 A * | 9/1998 | Brownell et al. ............. 29/740 |
| 5,893,409 A | 4/1999 | Kohler et al. .............. 165/80.3 |
| 5,903,434 A | 5/1999 | Chiou ........................ 361/704 |
| 6,023,413 A * | 2/2000 | Umezawa .................... 361/697 |
| 6,026,895 A * | 2/2000 | Moresco et al. ............. 165/185 |
| 6,125,037 A * | 9/2000 | Bollesen .................... 361/704 |
| 6,169,659 B1 * | 1/2001 | Wheaton ..................... 361/704 |
| 6,199,625 B1 * | 3/2001 | Guerrero .................... 165/80.3 |
| 6,212,074 B1 * | 4/2001 | Gonsalves et al. ........... 361/717 |
| 6,246,584 B1 | 6/2001 | Lee et al. ................... 361/704 |
| 6,341,065 B1 | 1/2002 | Lo ............................ 361/704 |
| 6,411,513 B1 * | 6/2002 | Bedard ....................... 361/704 |
| 6,459,582 B1 * | 10/2002 | Ali et al. ................... 361/704 |
| 2001/0003306 A1 | 6/2001 | Cook ......................... 165/80.3 |
| 2001/0030037 A1 | 10/2001 | Hellbruck et al. .......... 165/80.3 |

FOREIGN PATENT DOCUMENTS

EP 0777270 A1 4/1997

OTHER PUBLICATIONS

J. M. Mulligan, "Snap–On Heat Exchanger," IBM Technical Disclosure Bulletin vol. 10, No. 8, Jan. 1968.
F.E. Andros, E.W. Kunkler, G.C.Pedroza, and R.J.E. Shay, "One–Piece Snap–On Heat Sink," IBM Technical Disclosure Bulletin vol. 22, No. 1, Jun. 1979, pp. 71–72.

* cited by examiner

Primary Examiner—Boris Chérvinsky
(74) Attorney, Agent, or Firm—Floyd Gonzales; Cantor Colburn LLP

(57) ABSTRACT

A heat sink device interconnect including a mounting device, having a mounting device top, a board stiffener, wherein the board stiffener is disposed so as to be communicated with the mounting device and a heat sink device compressingly disposed between the mounting device top and the board stiffener, wherein the heat sink device includes a top plate, a bottom plate and a heat sink fin compressingly disposed between the top plate and the bottom plate. A method for implementing a heat sink device interconnect including obtaining an electronic module, a printed circuit board and a heat sink device interconnect having a heat sink device, an interconnect device, a mounting device and a board stiffener, arranging the electronic module, the printed circuit board and the heat sink device interconnect such that the electronic module and the printed circuit board is disposed between the board stiffener and the heat sink device and adjusting the mounting device so as to cause the electronic module to become compressingly associated with the printed circuit board.

21 Claims, 8 Drawing Sheets

COMPLIANT HEAT SINK DEVICE/ MOUNTING SYSTEM INTERCONNECT AND A METHOD OF IMPLEMENTING SAME

FIELD OF THE INVENTION

This invention relates generally to a heat sink device and a mounting system for an electronic module and more particularly to a combination heat sink device and mounting system interconnect for an electronic module having a land grid array (LGA) module package.

BACKGROUND OF THE INVENTION

As the demand for smaller, more powerful electronic systems increase, system manufacturers are tasked to find a way to increase system performance while decreasing the size of the electronic components within the electronic system. Two areas which have cause printed circuit board (PCB) designers problems include the communication between a PCB and an electronic module, such as a microprocessor and/or a mulit-chip module, and the dissipation of heat generated by an electronic module.

Electronic modules are usually communicated with a PCB via a physical connection between the PCB and the module. An electronic module having an LGA module package includes a plurality of pads, or lands, disposed about module periphery for communication with a PCB. The electronic module may include a die having a large number of electrical circuit elements, wherein one or more of the electrical circuit elements are associated with one or more of the pads so as to allow for communication between the electrical circuit elements and an external component, such as a PCB. In order for reliable communication to occur between the electronic module and a PCB, the electronic module must be disposed relative to the PCB so that the pads on the electronic module are non-movably associated with pads on the PCB. If the electronic module is allowed to move relative to the PCB, communication between the electronic module and the PCB may be compromised and performance may be degraded.

Unfortunately, conventional LGA designs require a large number of mechanical components (such as mounting structures, silos and springs) in order to non-movably associate the electronic module with the PCB. In addition, these designs tended to produce a non-uniform load distribution across the electronic module. As a result of this non-uniform load distribution, communication between the electronic module and the PCB may become compromised and additional structure is needed to uniformly distribute the load. As such, spatial concerns became a critical issue, especially since increases in PCB packaging density caused the amount of space allotted for electronic components to decrease. Furthermore, often times conventional mounting systems consist of steel alloy springs that have different expansion coefficients than the heat sink base and/or heat sink fins. As a result, the mismatch between the expansion coefficients during temperature excursions may cause a non-uniform load distribution.

Moreover, the addition of a heat sink to the electronic modules exacerbates the spatial problems discussed above. As an electronic module operates the electron flow within the module generates heat. If this heat is not removed, or dissipated, the electronic module may not operate correctly and may become damaged. Typically, the heat generated by the electronic module is dissipated by a cooling means, such as an aluminum (Al), copper (Cu) and/or copper alloy heat sink which absorbs and dissipates the heat via direct air convection. These conventional heat sinks are well known in the electronics industry and are used extensively to dissipate heat generated by electronic modules and other electronic components used in computers and various other electronic equipment. Because these heat sinks are usually attached to the electronic module via a mechanical means, even more space is consumed by a single electronic module.

Thus, a large number of components are required to incorporate an electronic module into a PCB and the space consumed by these components tend to dictate the size of the electronic system. This results in a significant increase in the cost of materials, manufacturing and production.

SUMMARY OF THE INVENTION

A heat sink device interconnect comprising: a mounting device, having a mounting device top; a board stiffener, wherein the board stiffener is disposed so as to be communicated with the mounting device; and a heat sink device compressingly disposed between the mounting device top and the board stiffener, wherein the heat sink device includes a top plate, a bottom plate and a heat sink fin compressingly disposed between the top plate and the bottom plate.

A method for implementing a heat sink device interconnect comprising: obtaining an electronic module, a printed circuit board and a heat sink device interconnect having a heat sink device, an interconnect device, a mounting device and a board stiffener; arranging the electronic module, the printed circuit board and the heat sink device interconnect such that the electronic module and the printed circuit board is disposed between the board stiffener and the heat sink device; and adjusting the mounting device so as to cause the electronic module to become compressingly associated with the printed circuit board.

BRIEF DESCRIPTION OF THE DRAWINGS

Referring to the exemplary drawings wherein like elements are numbered alike in the several figures.

DETAILED DESCRIPTION OF THE INVENTION

Figure 1A:
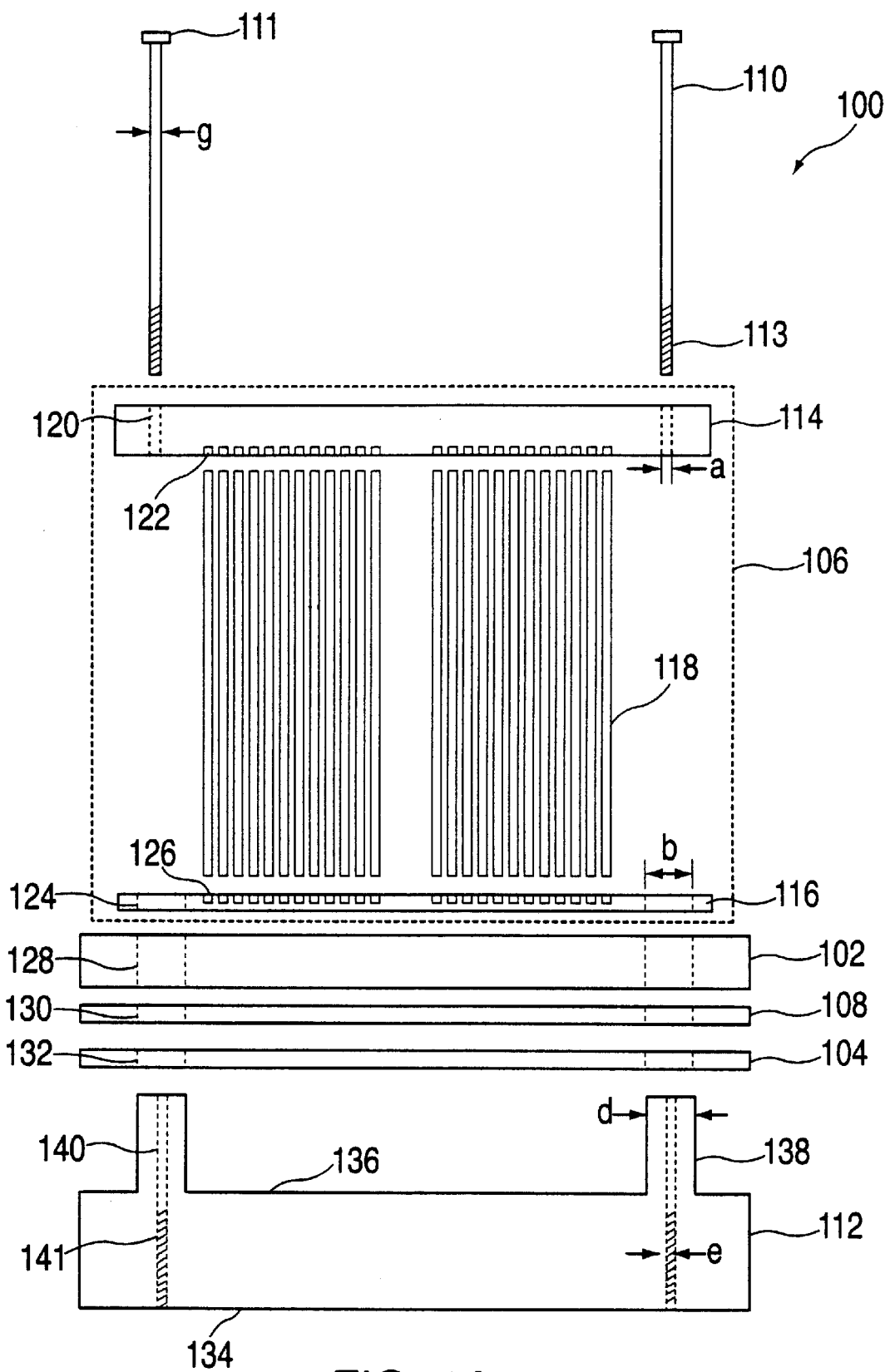
FIG. 1A is an exploded view of a heat sink device interconnect communicated with an electronic module and a PCB.
Figure 1B:
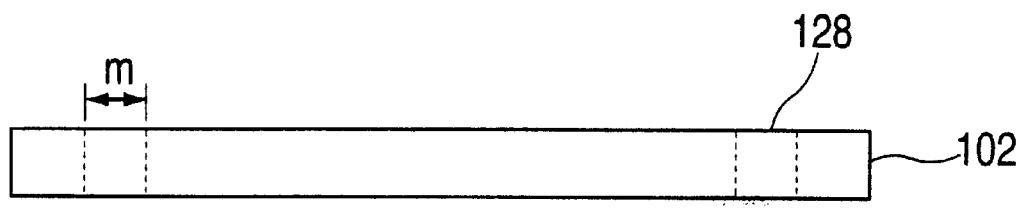
FIG. 1B shows an electronic module having module openings.
Figure 1C:
FIG. 1C shows an MCM interconnect having interconnect openings.
Figure 1D:
FIG. 1D shows a PCB having PCB openings.

Referring to FIG. 1A, FIG. 1B, FIG. 1C and FIG. 1D, a heat sink device interconnect 100 communicated with an electronic module 102 and a PCB 104, in accordance with an exemplary embodiment is shown and discussed. Heat sink device interconnect 100 includes a heat sink device 106, an interconnect device 108, a board stiffener 112 and a plurality of mounting devices 110, wherein mounting devices 110 include a threaded portion 111, a mounting device top 113 and a mounting device diameter g. Heat sink device 106 includes a top plate 114, a bottom plate 116 and a plurality of heat sink fins 118, wherein heat sink fins 118 are disposed so as to be sandwiched between top plate 114 and bottom plate 116. Top plate 114 includes a plurality of top plate openings 120 and a plurality of fin top slots 122, wherein top plate openings 120 include a top plate diameter, a, and wherein fin top slots 122 are disposed so as to be communicated with heat sink fins 118. Bottom plate 116 includes a plurality of bottom plate openings 124 and a plurality of fin bottom slots 126, wherein each of the bottom plate openings 124 include a bottom plate diameter, b, and wherein fin bottom slots 126 are disposed so as to be communicated with heat sink fins 118.

Electronic module 102 includes a plurality of module openings 128, wherein each of the module openings 128 includes a module diameter, m. Moreover, electronic module 102 is disposed relative to bottom plate 116 so as to sandwich bottom plate 116 between heat sink fins 118 and electronic module 102. Similarly, interconnect device 108 includes a plurality of interconnect openings 130 and is disposed so as to be adjacent to, and sandwiched between electronic module 102 and PCB 104, wherein each of the interconnect openings 130 include an interconnect diameter i. In addition, PCB 104 includes a plurality of PCB openings 132 each having a PCB diameter p. Board stiffener 112 includes a stiffener base 134 and a stiffener top 136, wherein stiffener top includes a plurality of stiffener guideposts 138, wherein each of the stiffener guideposts 138 has a guidepost diameter d and includes a stiffener mounting cavity 140 having a mounting cavity diameter, e. Board stiffener 112 is disposed so as to be adjacent to PCB 104, wherein PCB 104 is sandwiched between board stiffener 112 and interconnect device 108.

Figure 2:
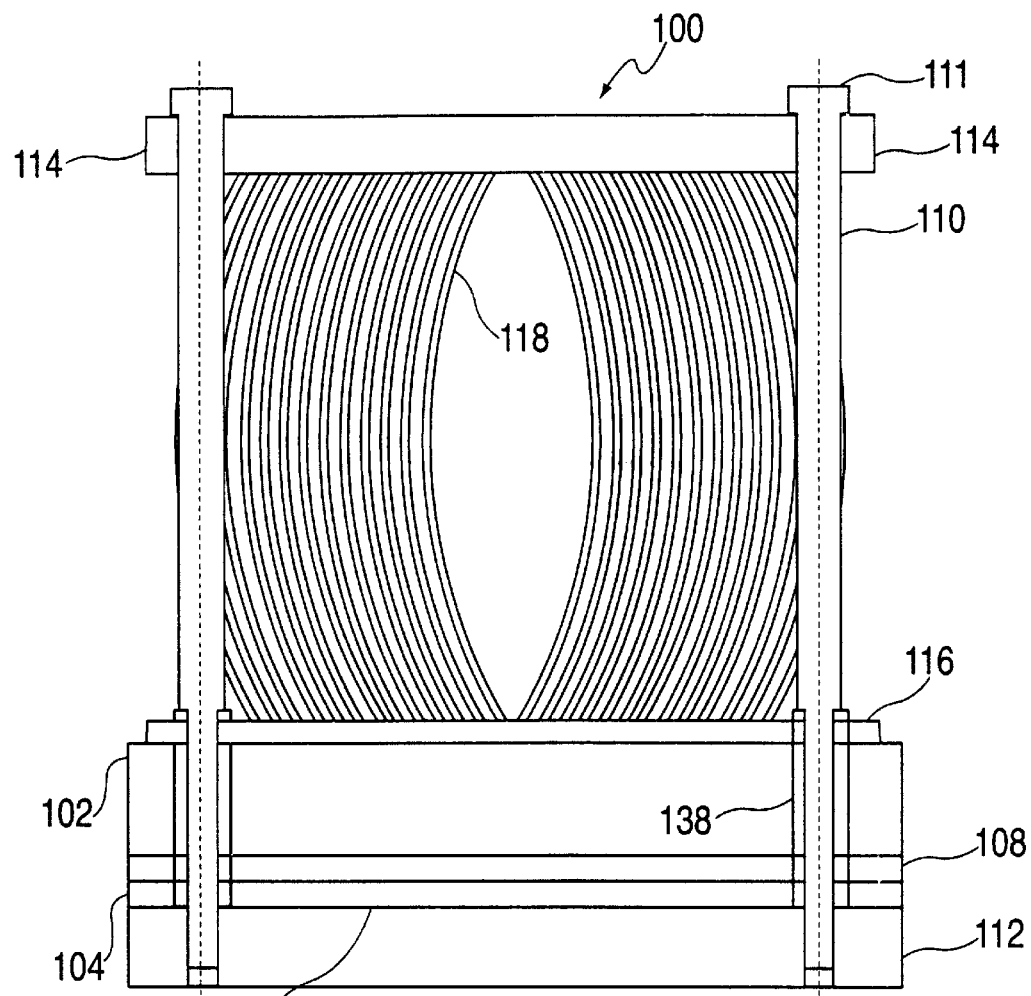
FIG. 2 is a front sectional view of a heat sink device interconnect communicated with an electronic module and a PCB.

Referring to FIG. 1 and FIG. 2, a front sectional view of heat sink device interconnect 100 communicated with electronic module 102 and a PCB 104 is shown and discussed. PCB 104 is disposed so as to be adjacent to stiffener top 136, such that stiffener guideposts 138 are communicated with and protruding from PCB openings 132. Interconnect device 108 is disposed so as to be adjacent to PCB 104, such that stiffener guideposts 138 are communicated with and protruding from interconnect openings 130 and so as to sandwich PCB 104 between interconnect device 108 and stiffener top 136. Electronic module 102 is disposed so as to be adjacent to interconnect device 108, such that stiffener guideposts 138 are communicated with and protruding from module openings 128. Bottom plate 116 is disposed so as to be adjacent to electronic module 102, such that stiffener guideposts 138 are communicated with and protruding from bottom plate openings 124. In addition, bottom plate 116 is disposed such that electronic module 102 is sandwiched between bottom plate 116 and interconnect device 108.

Plurality of heat sink fins 118 are disposed so as to be communicated with plurality of fin bottom slots 126, wherein one of each of the heat sink fins 118 is communicated with one of each of the plurality of fin bottom slots 126. Top plate 114 is disposed so as to sandwich the plurality of heat sink fins 118 between top plate 114 and bottom plate 116, wherein one of each of the heat sink fins 118 is communicated with one of each of the plurality of fin top slots 122. In accordance with an exemplary embodiment, each of the heat sink fins 118 is disposed so as to be non-movably communicated with fin top slots 122 and fin bottom slots 126. Mounting device 110 is disposed so as to be communicated with stiffener mounting cavity 140 via top plate opening 120, bottom plate opening 124, module opening 128, interconnect opening 130 and PCB opening 132.

In accordance with an exemplary embodiment, stiffening mounting cavity 140 preferably includes a threaded cavity portion 141 so as to receive threaded portion 111 of mounting device 110 such that when mounting device 110 is rotated, heat sink device 106 is mountingly and tighteningly associated with board stiffener 112. As mounting device 110 is rotated, threaded portion 111 engagingly interacts with threaded cavity portion 141 of stiffening mounting cavity 140 so as to cause mounting device top 113 to compressingly associate with top plate 114, thus causing top plate 114 and board stiffener 112 to become closer together. This causes top plate 114 to compressingly associate with bottom plate 116 via heat sink fins 118. This, in turn, causes bottom plate 116 to compressingly associate with electronic module 102, which becomes compressingly associated with interconnect device 108, which becomes compressingly associated with PCB 104. Although stiffening mounting cavity 140 is threaded so as to interact with mounting device 110 such that heat sink device 106 is mountingly and tighteningly associated with board stiffener 112, heat sink device 106 may be mountingly and tighteningly associated with board stiffener 112 using any device and/or method suitable to the desired end purpose, such as a bolt.

Figure 3:
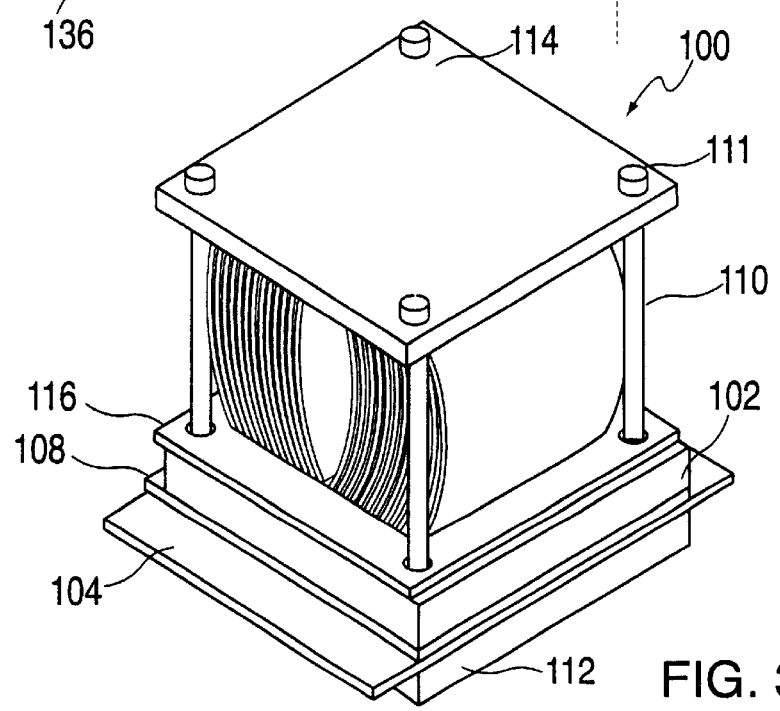
FIG. 3 is an isometric view of a heat sink device interconnect communicated with an electronic module and a PCB.
Figure 4:
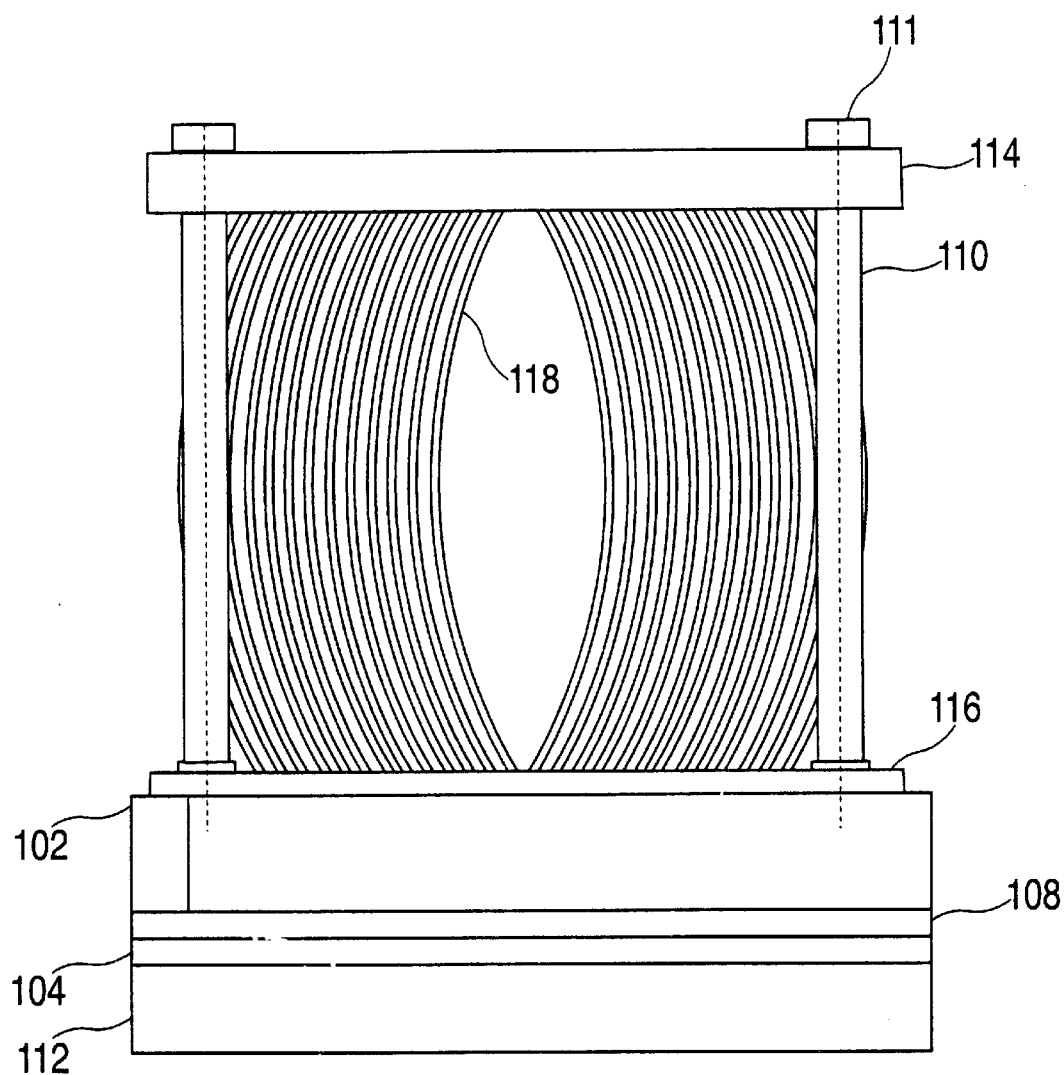
FIG. 4 is a front view of a heat sink device interconnect communicated with an electronic module and a PCB.
Figure 5:
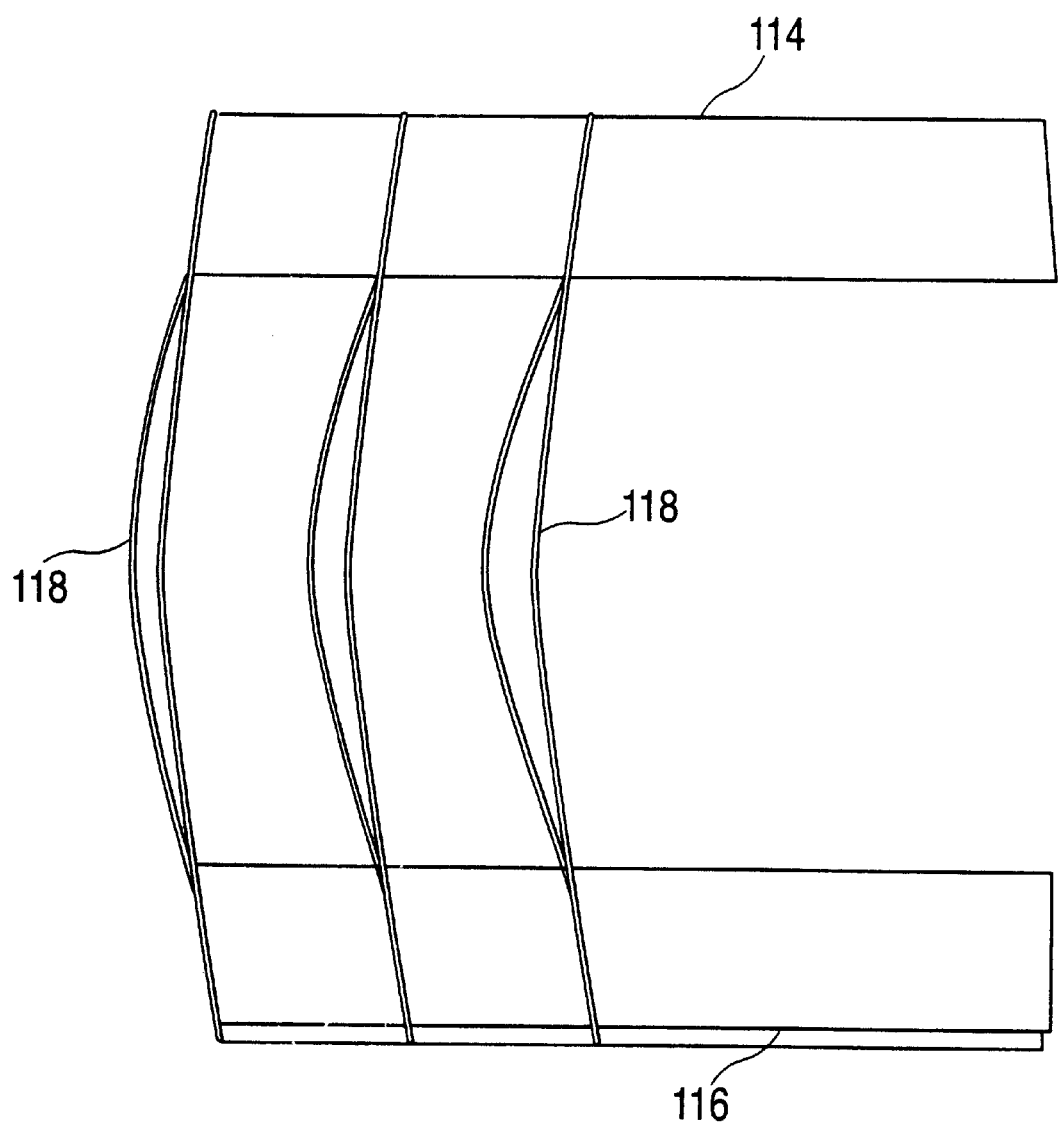
FIG. 5 shows the flexible characteristics of a heat sink device interconnect in accordance with an exemplary embodiment.

Referring to FIG. 3 and FIG. 4, mounting device 110 is rotated until heat sink fins 118, electronic module 102, interconnect device 108 and PCB 104 are compressed to a desired pressure. Referring to FIG. 5, as heat sink fins 118 are compressed they bend so as to act as a spring and so as to be subjected to the compressive loads of the fastening system. This advantageously allows each heat sink fin 118 to become a spring wherein, heat sink fins 118 would be loaded to a controlled elastic deflection so as to account for a components' tolerance. Additionally, the vertical design coupled with the deflection properties of heat sink fins 118 allows for an efficient airflow through heat sink interconnect 100.

Heat sink fins 118 may advantageously act in parallel so as to provide a significant uniform loading across electronic module 102. Moreover, only a few predetermined heat sink fins 118 may advantageously be deflected so as to provide lower loads. As such, loading and displacement may be tailored to a particular application or may be adjusted so as to advantageously accommodate a components' unique requirements by altering the number of deflected fins and/or by changing the shape and size of the deflected fins. Furthermore, heat sink interconnect 100 advantageously provides compliance for device camber as well as advantageously allowing for single axis assembly.

Figure 6:
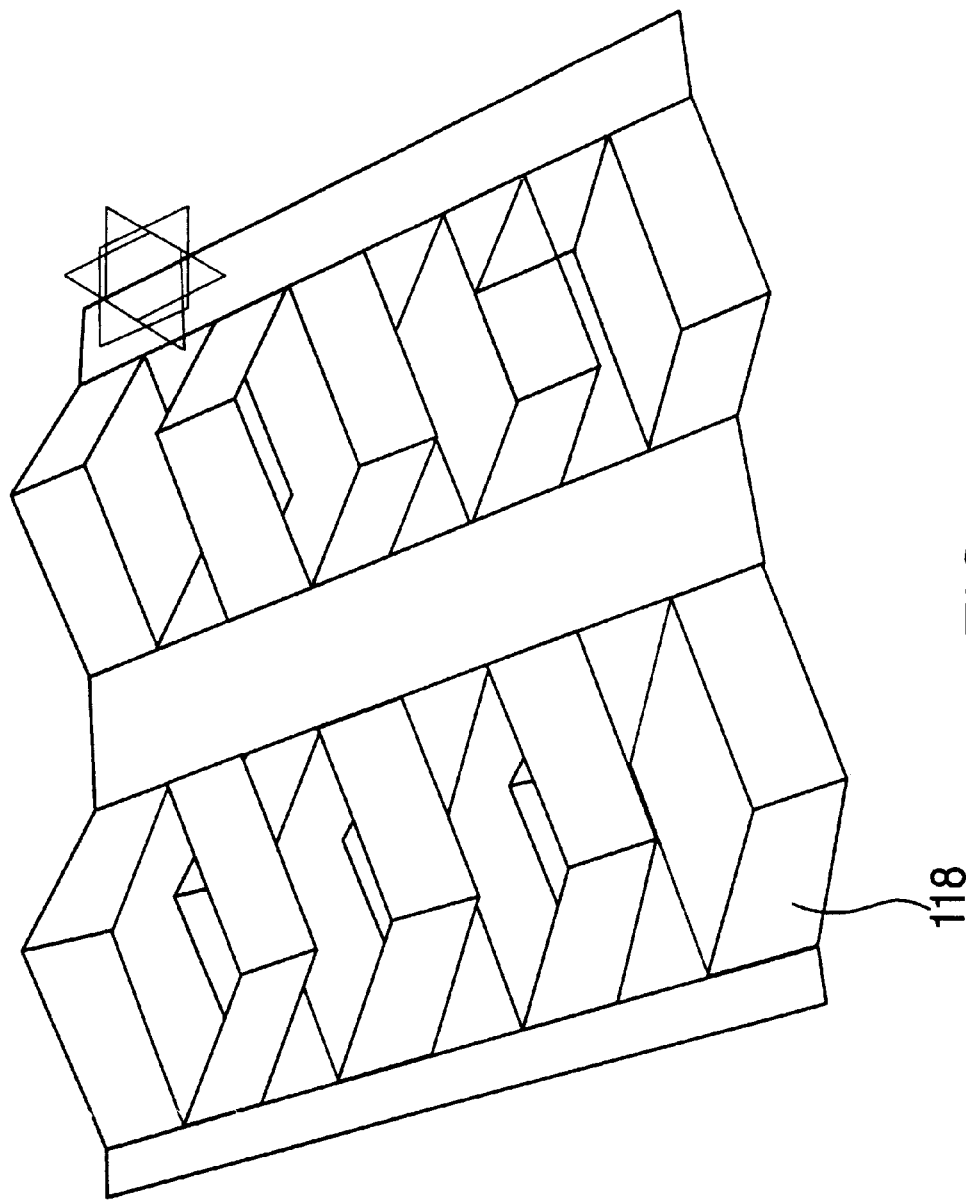
FIG. 6 shows a second embodiment of a heat sink fin.
Figure 7:
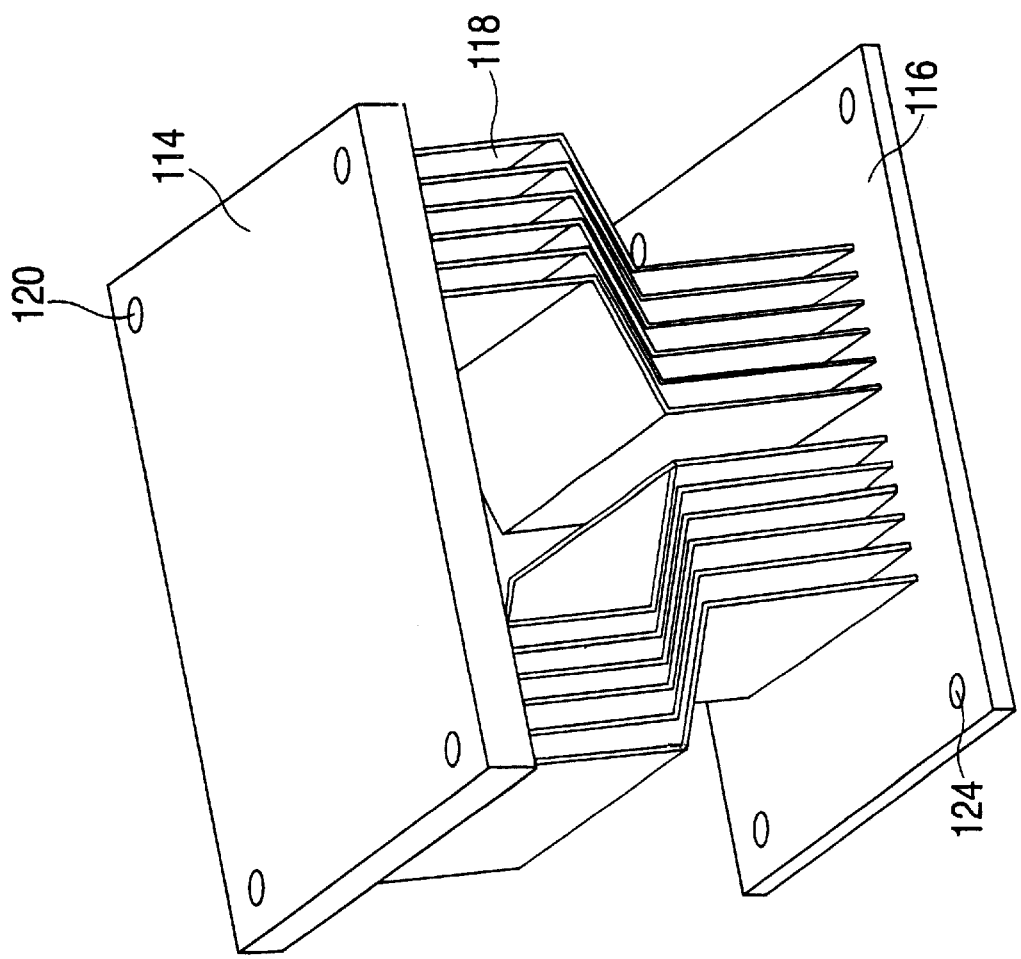
FIG. 7 shows heat sink device interconnect having a third embodiment of a heat sink fin.

Referring to FIG. 6 and FIG. 7, a second and third embodiment of heat sink fins 118 are shown and discussed. In these embodiment, heat sink fins 118 preferably include at least one bend and/or flexible portion. This embodiment advantageously allows for a softer and/or less rigid structure and provides for an increased heat dissipating capability by increasing the surface area of heat sink fins 118. In accordance with an exemplary embodiment, heat sink fins 118 advantageously interface with top plate 114 and bottom plate 116 in a similar manner as the first embodiment of heat sink fins 118. It is considered within the scope of the embodiments, that heat sink fins 118 may be constructed of a plurality of thermally conductive materials and/or may be constructed of a plurality of structurally load bearing materials and/or a combination thereof. It is further considered within the scope of the embodiments that heat sink fins 118 may be constructed so as to be mechanically active. This may advantageously allow heat sink fins 118 to controllably bend when subjected to a predetermined load such that a uniform load may be provided over a larger displacement.

Figure 8:
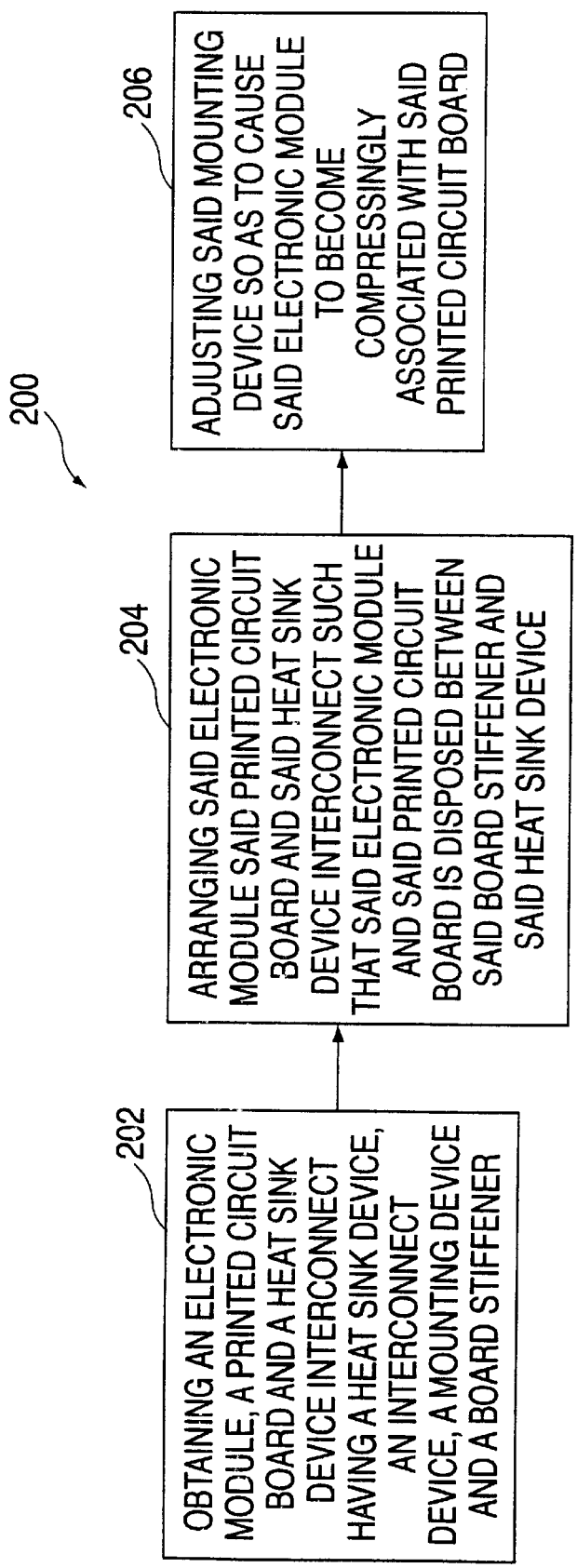
FIG. 8 shows a block diagram illustrating a method for implementing a heat sink device interconnect, in accordance with an exemplary embodiment.

Referring to FIG. 8, a method for implementing a heat sink device interconnect 200 is shown and discussed. An electronic module, a printed circuit board and a heat sink device interconnect having a heat sink device, an interconnect device, a mounting device and a board stiffener is obtained as shown in step 202. Heat sink device preferably includes a top plate, a bottom plate and a plurality of heat sink fins, wherein the plurality of heat sink fins are compressingly disposed between the top plate and the bottom plate. In addition, top plate includes a top plate opening, bottom plate includes a bottom plate opening, electronic module includes a module opening, interconnect device includes an interconnect opening, printed circuit board includes a PCB opening and board stiffener includes a stiffener guidepost having a stiffener mounting cavity.

Electronic module 102, printed circuit board 104 and heat sink device interconnect 100 is then arranged such that electronic module 102 and printed circuit board 104 are disposed between board stiffener and heat sink device 106 as shown in step 204. Moreover, printed circuit board 104, interconnect device 108, electronic module 102 and bottom plate 116 are further arranged such that stiffener guidepost 138 is communicated with PCB opening 132, interconnect opening 130, module opening 128 and bottom plate opening 124. Furthermore, top plate 114 is disposed such that top plate opening 120 is communicated with stiffener mounting cavity 140.

Mounting device 110 is then adjusted so as to cause electronic module 102 to become compressingly associated with printed circuit board 104 as shown in step 206. This may be accomplished by communicating mounting device 110 with stiffener mounting cavity 140 via top plate opening 120. Mounting device 110 is then rotated so as to cause top plate 114 to become compressingly associated with printed circuit board 104 and/or heat sink fins 118.

Although heat sink fins 118 are preferably constructed from a beryllium copper material, heat sink fins 118 may be constructed from any thermally conductive material having elastic properties suitable to the desired end purpose. Moreover, although heat sink device 106 is preferably constructed of a silver copper material, heat sink device 106 may be constructed of any thermally conductive material having sufficiently rigid properties suitable to the desired end purpose.

Heat sink interconnect 100 may be used with any type of electronic module suitable to the desired end purpose, such as a processor and/or a microcomputer.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A heat sink device interconnect comprising:
a mounting device, having a mounting device top;
a board stiffener, wherein said board stiffener is disposed so as to be communicated with said mounting device; and
a heat sink device compressingly disposed between said mounting device top and said board stiffener, wherein said heat sink device includes a top plate having a plurality fin top slots, a bottom plate having a plurality of fin bottom slots and a plurality of heat sink fins compressingly disposed between said top plate and said bottom plate and communicated with said fin top slots and said fin bottom slots.

2. A heat sink device interconnect according to claim 1 further comprising a module interconnect device compressingly disposed between said bottom plate and said board stiffener.

3. A heat sink device interconnect according to claim 1, further comprising and interconnect device, a printed circuit board and an electronic module, wherein said printed circuit board includes a PCB opening and wherein said electronic module includes a module opening.

4. A heat sink device interconnect according to claim 3, wherein said bottom plate includes a bottom plate opening and wherein said interconnect device includes an interconnect opening.

5. A heat sink device interconnect according to claim 4, wherein said board stiffener includes a stiffener guidepost, wherein said stiffener guidepost is disposed so as to he communicated with said PCB opening, said interconnect opening, said module opening and said bottom plate opening.

6. A heat sink device interconnect according to claim 1, wherein said board stiffener includes a stiffener guidepost having a stiffener mounting cavity and wherein said top plate includes a top plate opening disposed such that said top plate opening is communicated with said stiffener mounting cavity.

7. A heat sink device interconnect according to claim 6, wherein said mounting device is disposed so as to be communicated with said stiffener mounting cavity via said top plate opening.

8. A heat device interconnect according to claim 6, wherein said mounting device having a threaded portion and said stiffener mounting cavity having a threaded cavity portion, wherein said threaded portion is disposed so as to engagingly interact with said threaded cavity portion.

9. A heat sink device interconnect according to claim 1, wherein said heat sink fin is constructed of a thermally conductive material.

10. A heat sink device interconnect according to claim 1, wherein said heat sink fin is constructed of a flexible material.

11. A heal sink device interconnect according to claim 1, wherein said stiffening plate is constructed of a electrically non-conductive material.

12. A heat sink device interconnect according to claim 1, wherein said heat sink fin may be constructed of a plurality of thermally conductive materials.

13. A heat sink device interconnect according to claim 1, wherein said heat sink fin may be constructed of a plurality of structurally load bearing materials.

14. A heat sink device interconnect according to claim 1, wherein said heat sink fin may be constructed so as to controllably bend under a predetermined load.

15. A method for implementing a heat sink device interconnect comprising:

obtaining an electronic module, a printed circuit board and a heat sink device interconnect having a heat sink device, an interconnect device, a mounting device and a board stiffener;

arranging said electronic module; said printed circuit board and said heat sink device interconnect such that said electronic module and said printed circuit board is disposed between said board stiffener and said heat sink device; and adjusting said mounting device so as to cause said electronic module to become compressingly associated with said printed circuit board and so as to communicate with said electronic module, said printed circuit board, said heat sink device interconnect, said interconnect device and said board stiffener.

16. A method according to claim 15, wherein said obtaining further includes obtaining a heat sink device having a top plate, a bottom plate and a plurality of heat sink fins, wherein said plurality of heat sink fins are compressingly disposed between said top plate and said bottom plate.

17. A method according to claim 16, wherein said top plate includes a top plate opening, said bottom plate includes a bottom plate opening, said electronic module includes a module opening, said interconnect device includes an interconnect opening, said printed circuit board includes a PCB opening and said board stiffener includes a stiffener guidepost having a stiffener mounting cavity.

18. A method according to claim 17, wherein said arranging includes arranging said printed circuit board, said interconnect device, said electronic module and said bottom plate such that said stiffener guidepost is communicated with said PCB opening, said interconnect opening, said module opening and said bottom plate opening.

19. A method according to claim 17, wherein said top plate is disposed such that said top plate opening is communicated with said stiffener mounting cavity.

20. A method according to claim 19, wherein said adjusting includes communicating said mounting device with said stiffener mounting cavity via said top plate opening.

21. A method according to claim 20, wherein said adjusting further includes rotating said mounting device so as to cause said top plate to become compressingly associated with said printed circuit board.

\* \* \* \* \*